United States Patent [19]
Noguchi

[11] Patent Number: 6,080,239
[45] Date of Patent: *Jun. 27, 2000

[54] METHOD OF GROWING SINGLE SEMICONDUCTOR CRYSTAL AND SEMICONDUCTOR DEVICE WITH SINGLE SEMICONDUCTOR CRYSTAL

[75] Inventor: Takashi Noguchi, Kanagawa, Japan

[73] Assignee: Sony Corporation, Tokyo, Japan

[ * ] Notice: This patent is subject to a terminal disclaimer.

[21] Appl. No.: 08/795,338

[22] Filed: Feb. 4, 1997

Related U.S. Application Data

[63] Continuation of application No. 08/159,565, Dec. 1, 1993, Pat. No. 5,663,579.

[30] Foreign Application Priority Data

Dec. 3, 1992 [JP] Japan .................................. 4-324384

[51] Int. Cl.[7] .................................................. C30B 25/12
[52] U.S. Cl. .............................. 117/92; 117/43; 117/904; 117/935
[58] Field of Search ............................... 117/43, 92, 935, 117/904

[56] References Cited

U.S. PATENT DOCUMENTS

| | | |
|---|---|---|
| 4,543,133 | 9/1985 | Mukai . |
| 4,661,167 | 4/1987 | Kusunoki .................................. 117/43 |
| 4,822,751 | 4/1989 | Ishizu et al. . |
| 5,264,072 | 11/1993 | Mukai ....................................... 117/43 |
| 5,663,579 | 9/1997 | Noguchi .................................... 117/43 |

*Primary Examiner*—Robert Kunemund
*Attorney, Agent, or Firm*—Hill & Simpson

[57] ABSTRACT

A semiconductor film deposited on a substrate has regions of different thermal conductivity. A pulsed laser radiation is applied to the semiconductor film to melt the semiconductor film. When the melted semiconductor film is cooled and solidified, localized low-temperature regions are developed in the respective regions of different thermal conductivity. Crystal nuclei are produced in the respective localized low-temperature regions and grown into a single semiconductor crystal. The regions of different thermal conductivity are formed in the semiconductor film by high-thermal-conductivity members deposited on the semiconductor film in thermally coupled relationship thereto. A semiconductor device is fabricated using the semiconductor film and has channels disposed in the vicinity of the crystal nuclei.

10 Claims, 5 Drawing Sheets

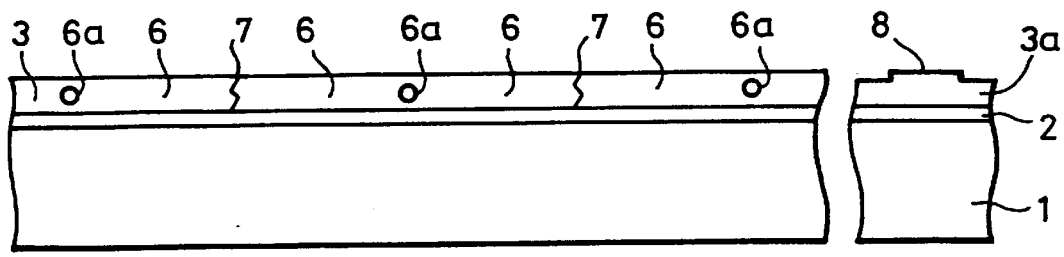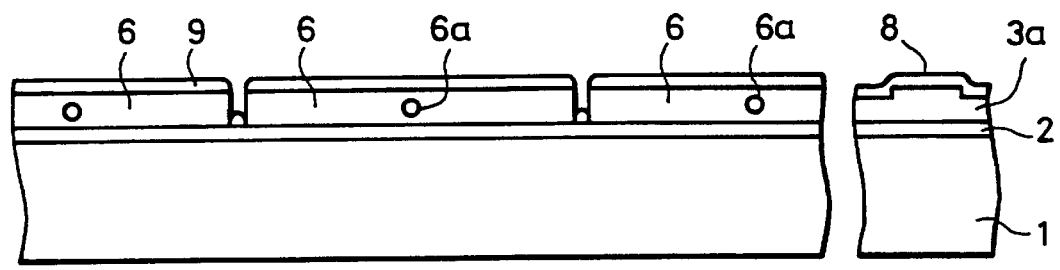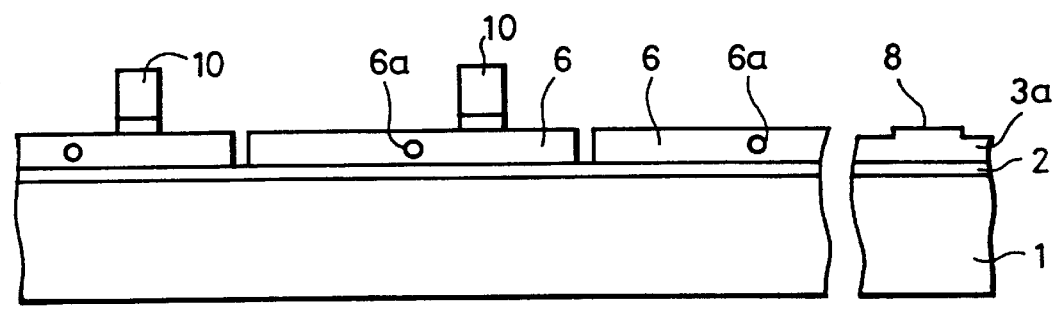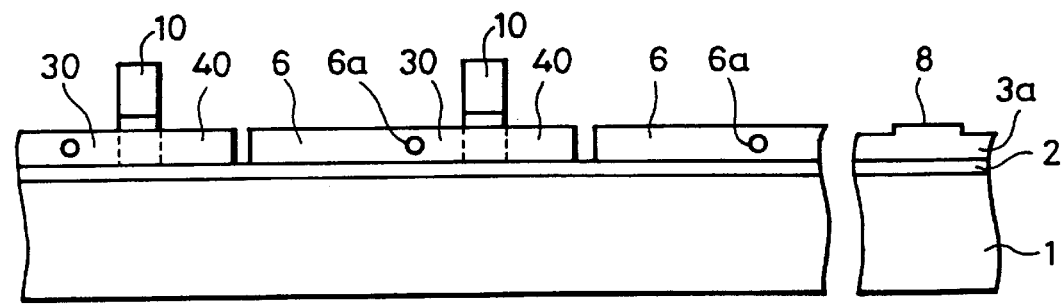

METHOD OF GROWING SINGLE SEMICONDUCTOR CRYSTAL AND SEMICONDUCTOR DEVICE WITH SINGLE SEMICONDUCTOR CRYSTAL

This is a continuation of application Ser. No. 08/159,565, filed Dec. 1, 1993, now U.S. Pat. No. 5,663,579.

BACKGROUND OF THE INVENTION

1. Field of the Invention

The present invention relates to a method of growing a single crystal in low-temperature regions in a semiconductor film that is deposited on a substrate, and a semiconductor device fabricated using such a semiconductor film with a grown single crystal.

2. Description of the Related Art

Static random-access memories (SRAMs) of the high-resistance-load type fabricated using a semiconductor film deposited on a substrate comprise load-type memory cells that are fabricated of a polycrystalline semiconductor, i.e., polycrystalline silicon. However, it is difficult for the SRAMs of the high-resistance-load type to maintain sufficient levels of operating margin, reliability, standby current.

To solve the above problem, there has been proposed a laminated SRAM using, as load elements, thin-film transistors formed in a polycrystalline semiconductor of highly uniform film qualities, e.g., polycrystalline silicon.

Various processes have heretofore been proposed for fabricating a polycrystalline semiconductor to manufacture such a thin-film semiconductor device.

The proposed processes include a chemical vapor deposition process, a random solid-phase growing process, and a process of selectively forming a single-crystal region.

One conventional example of the process of selectively forming a single-crystal region will be described below with reference to FIGS. 1A through 1C of the accompanying drawings.

As shown in FIG. 1A, a low dose (for example, $1 \times 10^{14} \text{cm}^{-2}$ at 40 KeV) of silicon ions ($Si^+$) is introduced into a polycrystalline silicon layer 3 on a silicon oxide layer 2 by ion implantation. Then, as shown in FIG. 1B, a resist mask 20 is deposited on the polycrystalline silicon layer 3, and a high dose (for example, $2 \times 10^{15} \text{cm}^{-2}$ at 40 KeV) of silicon ions ($Si^+$) is introduced selectively into the polycrystalline silicon layer 3 selectively in those regions which are not covered with the resist mask 20. Thereafter, the resist mask 20 is removed, and, as shown in FIG. 1C, crystals are grown in the ion-implanted regions by a low-temperature solid-phase growing process at a temperature of 600° C. for 20 hours, thus producing single-crystal silicon regions 6.

However, fabrication of the above thin-film semiconductor device poses various problems as described below:

(1) If a polysilicon film is formed of large crystal grain according to the normal chemical vapor deposition process, then the film qualities suffer a lack of uniformity, making it difficult to fabricate a polycrystalline semiconductor film with high electron mobility at low leakage.

(2) The random solid-phase growing process allows fabrication of a polycrystalline semiconductor film of a large grain size of 1 μm or greater. Since, however, it is difficult to grow the single crystal grain selectively in a desired position, a desired transistor cannot easily be fabricated in the desired position regardless of the large grain size available. The solid-phase growing process makes it difficult to form a single-crystal layer in a wide area because of the presence of minute defects. If a transistor were formed in such a single-crystal layer, then its channel would be located in the grain boundary or crystal defects would be present in the channel, resulting in low reliability due to an increased leak current or large variations of a threshold voltage Vth.

(3) To produce SOI (Silicon On Insulator) or SOS (Silicon On Sapphire) arrangements, there have been proposed an argon-laser application process, a zone-melt process, and a process of bonding a silicon-crystal semiconductor substrate to an insulative substrate and thereafter grinding the silicon-crystal semiconductor substrate to a desired thickness, thereby producing a thin silicon-crystal semiconductor film. However, these processes under poor reproducibility and low throughput.

(4) Many research efforts have been directed in recent years to the fabrication of a thin silicon-crystal semiconductor film using a laser for applying a pulsed UV (ultraviolet) radiation in a plane, i.e., an excimer laser. Since the ultraviolet radiation is absorbed by silicon, such a process is considered effective in forming a semiconductor film on a glass substrate, for example. Actually, however, only a thin polycrystalline film is formed in many occasions.

OBJECTS AND SUMMARY OF THE INVENTION

It is an object of the present invention to provide a method of growing a single semiconductor crystal reliably in a desired position with high reproducibility at a high throughput.

Another object of the present invention is to provide a method of growing a single semiconductor crystal reliably from crystal nuclei which are produced in respective localized low-temperature regions formed in a semiconductor film by regions of different thermal conductivity therein when the semiconductor film is melted and then cooled.

Still another object of the present invention is to provide a method of producing a single semiconductor crystal of large grain size reliably and efficiently from crystal nuclei which are produced in respective localized low-temperature regions formed in a semiconductor film.

Yet still another object of the present invention is to provide a semiconductor device which is fabricated in a single semiconductor crystal and free of a leak current, variations of a threshold voltage, and poor reliability.

According to the present invention, there is provided a method of growing a single semiconductor crystal, comprising the steps of forming a semiconductor film including regions of different thermal conductivity on a substrate, applying a pulsed laser radiation to the semiconductor film to melt the semiconductor film, and cooling the melted semiconductor film to develop localized low-temperature regions in the regions of different thermal conductivity thereby to produce a single crystal in the semiconductor film.

According to the present invention, there is also provided a semiconductor device comprising a substrate, a semiconductor film disposed on the substrate and including a region of different thermal conductivity, the region of different thermal conductivity including a localized low-temperature region having a crystal nucleus developed when the semiconductor film is melted with a pulsed laser radiation and then cooled, and a channel disposed near the crystal nucleus.

The above and other objects, features, and advantages of the present invention will become apparent from the following description of illustrative embodiments thereof to be read in conjunction with the accompanying drawings, in which like reference numerals represent the same or similar objects.

BRIEF DESCRIPTION OF THE DRAWINGS

FIGS. 5A through 5D are fragmentary cross-sectional views showing a process of fabricating thin-film transistors using the single semiconductor crystal produced according to the present invention.

DETAILED DESCRIPTION OF THE PREFERRED EMBODIMENTS

Figure 1A:
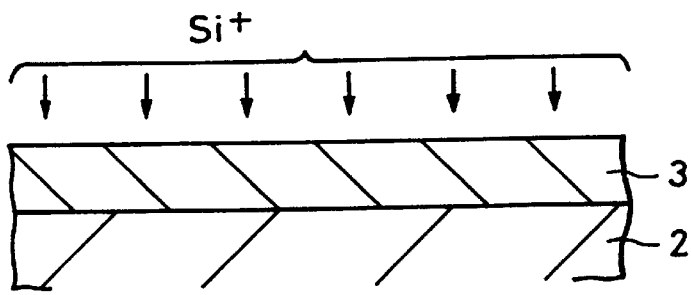
FIGS. 1A through 1C are fragmentary cross-sectional views showing a conventional process of selectively forming a single-crystal region in a polycrystalline silicon layer.
Figure 1B:
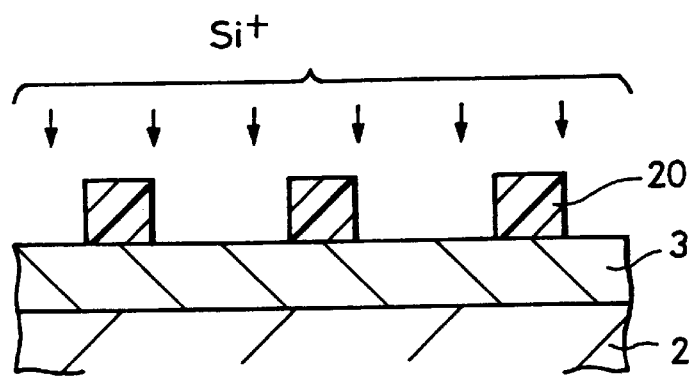
Figure 1C:
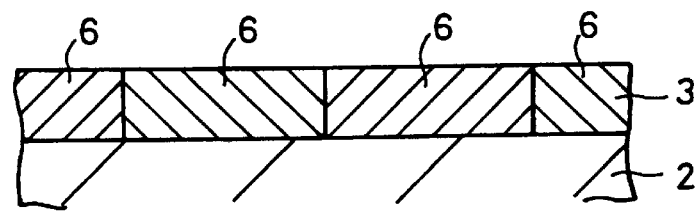
Figure 2A:
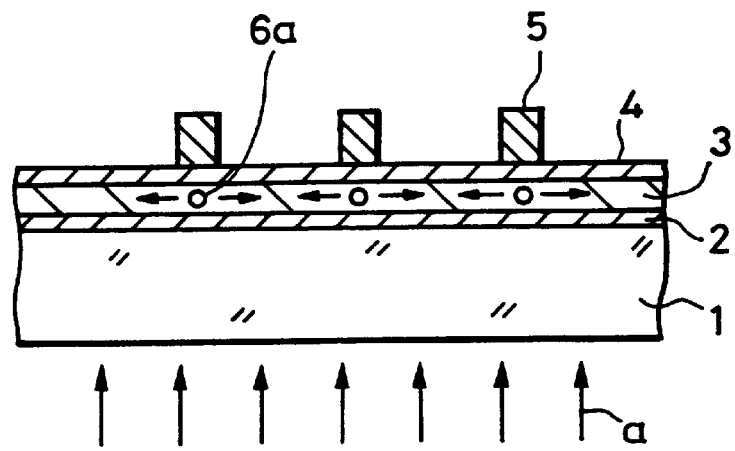
FIGS. 2A through 2C are fragmentary cross-sectional views showing a process of forming a single semiconductor crystal and a temperature distribution according to a first embodiment of the present invention.
Figure 2B:
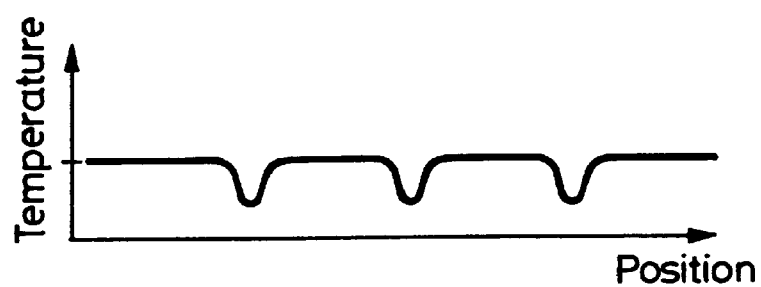

1st Embodiment:

A process of forming a single semiconductor crystal according to a first embodiment of the present invention will be described below with reference to FIGS. 2A through 2C.

According to the first embodiment, a single semiconductor crystal is formed in an SOI arrangement. An insulative substrate 1 such as a glass substrate is highly transmissive of a pulsed laser radiation, i.e., an excimer laser radiation, which will subsequently be applied. As shown in FIG. 2A, a first material layer 2 such as an insulative layer of $SiO_2$, SiN, or the like, for example, which has relatively low thermal conductivity and highly transmissive of an excimer laser radiation is deposited to a thickness of about 0.1 μm or less on the insulative layer 1 by way of CVD (Chemical Vapor Deposition), and then a semiconductor film 3, e.g., a silicon film, is deposited to a thickness of about 0.1 μm or less on the first material layer 2.

The semiconductor film 3 may be deposited as an amorphous silicon film or a polycrystalline silicon film that is formed using $SiH_4$ at 500° C. by low-pressure (LP) CVD, or by introducing silicon ions $Si^+$ at a dose of $1 \times 10^{15} cm^{-2}$ or more at 40 KeV into such a polycrystalline silicon film by ion implantation, thereby rendering the film amorphous.

Then, a second material layer 4 such as an insulative layer of $SiO_2$, SiN, or the like, for example, which has relatively low thermal conductivity and highly transmissive of an excimer laser radiation is deposited to a thickness of about 0.1 μm or less on the semiconductor film 3 by way of LPCVD or plasma CVD. Thereafter, a silicon layer, for example, which has higher thermal conductivity than the first and second material layers 2, 4, is deposited to a thickness of 0.2 μm on the second material layer 4, using $Si_2H_6$, by LPCVD at 450° C. The silicon layer thus deposited is thereafter pattern-etched by photolithography or the like, thus selectively forming high-thermal-conductivity members 5 in desired positions on the second material layer 4.

The high-thermal-conductivity members 5 are arranged in a pattern of islands, or in a stripe pattern, or a grid pattern at spaced intervals of 20 μm, for example.

Then, an excimer laser radiation, i.e., an UV pulsed laser radiation, is applied in a plane from a laser source of an XeCl gas at a wavelength of 308 nm with a pulse duration of 50 ns to the substrate 1 from its reverse side as indicated by the arrows a.

The thermal energy of the applied pulsed laser radiation is absorbed by the semiconductor film 3, which is now temporarily melted.

When the application of the pulsed laser radiation is interrupted, the temperature of the semiconductor film 3 is lowered, turning the semiconductor film 3 into a solid phase. As the semiconductor film 3 is cooled, local low-temperature regions are developed therein immediately below the respective high-thermal-conductivity members 5 because the heat is well radiated by the high-thermal-conductivity members 5, as indicated by a temperature distribution along the film surface in FIG. 2B. Therefore, crystal nuclei 6a are produced in the respective local low-temperature regions as shown in FIG. 2A. As the temperature around the crystal nuclei 6a is lowered, the crystal is grown radially outwardly from the crystal nuclei 6a as indicated by the arrows in FIG. 2A until the semiconductor film 3 is turned into a single crystal in its entire area or a wide area thereof.

Thereafter, the high-thermal-conductivity members 5 are removed as by plasma etching. In this manner, there has been produced a substrate composed of the single-crystal semiconductor film 3 on the glass substrate 1 for fabricating therein an SOI thin-film semiconductor device, i.e., thin-film transistors, or driver transistors for a liquid-crystal display unit.

2nd Embodiment:

A process of forming a single semiconductor crystal according to a second embodiment of the present invention will be described below with reference to FIGS. 3A, 3B and 4A through 4C.

Figure 3A:
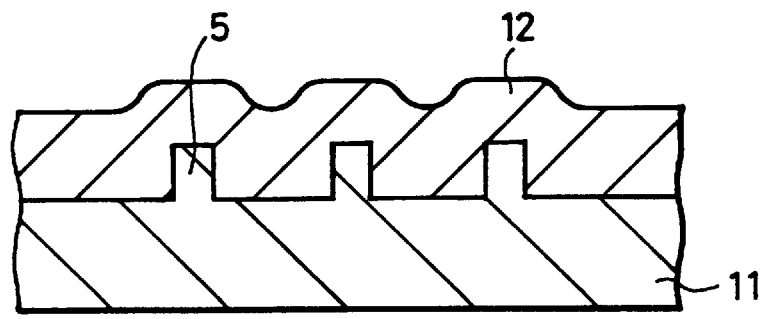
FIGS. 3A, 3B, 4A through 4C are fragmentary cross-sectional views showing a process of forming a single semiconductor crystal and a temperature distribution according to a second embodiment of the present invention.

As shown in FIG. 3A, high-thermal-conductivity members 5 in a pattern of islands, or in a stripe pattern, or a grid pattern are formed at spaced intervals of 10 μm, for example, on a principal surface of a single-crystal silicon substrate 11 that is a thermal conductor by photolithography and reactive ion etching (RIE) in a gas atmosphere of $Cl_2$ and $O_2$ under 50 mTorr (6.66 Pa) with a power of 0.8 KW.

Then, a material layer 12 of $SiO_2$ or the like which is less thermally conductive than the high-thermal-conductivity members 5 is deposited on the entire surface formed so far, embedding the high-thermal-conductivity members 5, by bias ECR, or CVD, or the like.

Figure 3B:
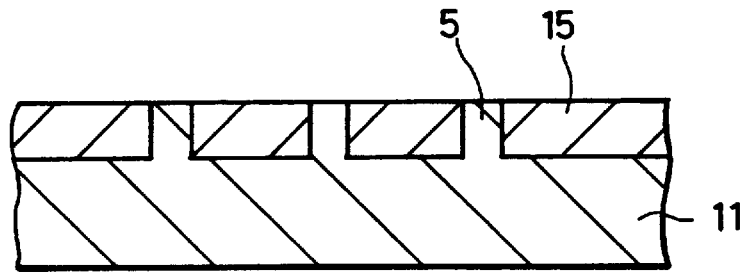

Thereafter, as shown in FIG. 3B, the material layer 15 is chemically or mechanically ground flatwise until the high-thermal-conductivity members 5 are exposed. When the materially layer 15 is thus ground, the high-thermal-conductivity members 5 and a low-thermal-conductivity region 15 which is composed of the material layer 12 and has a thickness of about 0.1 μm or less are exposed on the principal surface formed so far.

Figure 4A:
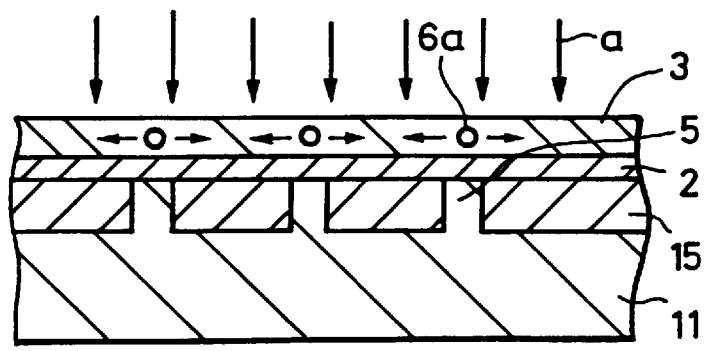
Figure 4B:
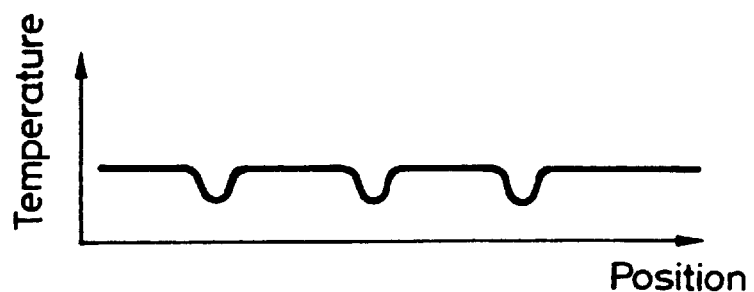

Then, as shown in FIG. 4A, an insulative layer 2 of $SiO_2$, SiN, or the like, for example, which has relatively low thermal conductivity is deposited to a thickness of about 0.1 μm or less, e.g., 0.05 μm, on the principal surface where the high-thermal-conductivity members 5 and the low-thermal-conductivity region 15 are exposed, by LPCVD or the like.

Thereafter, a semiconductor film 3 of the same kind as described above is deposited to a thickness of 0.1 μm or less on the insulative layer 2 using $SiH_4$ at 500° C. by LPCVD, followed by the application of an excimer laser radiation as indicated by the arrows a in FIG. 4A.

When the application of the pulsed laser radiation is interrupted, the temperature of the semiconductor film 3 is lowered, turning the semiconductor film 3 into a solid phase. As the semiconductor film 3 is cooled, local low-temperature regions are developed therein immediately below the respective high-thermal-conductivity members 5 because the heat is well radiated by the high-thermal-conductivity members 5, as indicated by a temperature distribution along the film surface in FIG. 4B. Therefore, crystal nuclei 6a are produced in the respective local low-temperature regions as shown in FIG. 4A. As the temperature around the crystal nuclei 6a is lowered, the crystal is grown radially outwardly from the crystal nuclei 6a as indicated by the arrows in FIG. 4A until the semiconductor film 3 is turned into a single crystal in its entire area or a wide area thereof.

Figure 4C:
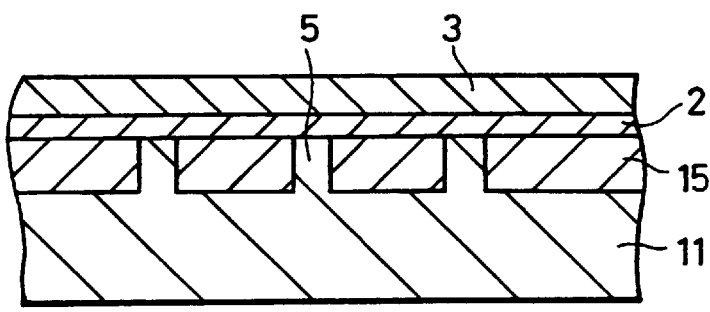

The semiconductor film 3 which is crystallized upon cooling is illustrated in FIG. 4C.

In this manner, there has been produced a substrate composed of the single-crystal semiconductor film 3 on the insulative layer 2 over the single-crystal substrate 11 for fabricating therein a thin-film semiconductor device, i.e., thin-film transistors, or driver transistors for a liquid-crystal display unit.

3rd Embodiment:

A process of fabricating thin-film transistors using the single semiconductor crystal produced according to the present invention will be described below with reference to FIGS. 5A through 5D.

According to the third embodiment, thin-film transistors are fabricated using the single-crystal semiconductor film 3 which has been formed by the process according to the first embodiment described above.

Figure 2C:
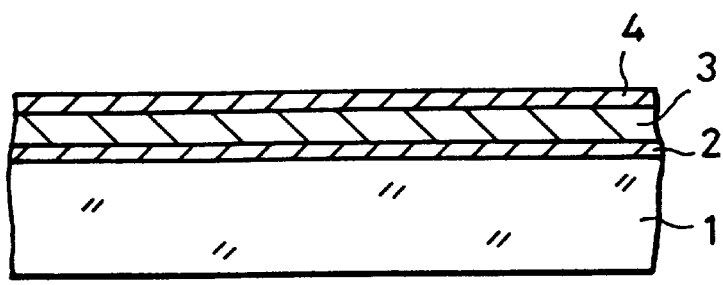

The second material layer 4 deposited on the semiconductor film 3 shown in FIG. 2C is removed with an aqueous solution of ammonium fluoride ($NH_4F$). Thereafter, as shown in FIG. 5A, an alignment mark 8 is formed in the form of a raised step having a height of about 0.05 $\mu$m on a region 3a of the semiconductor film 3 by photolithography and RIE. The RIE is carried out in a gas atmosphere of $Cl_2$ and $O_2$ under 50 mTorr (6.66 Pa) with a power of 0.8 KW. A grain boundary 7 is developed in the semiconductor film 3 by crystal growth as shown in FIG. 5A.

Then, as shown in FIG. 5B, single-crystal silicon regions 6 around the respective crystal nuclei 6a are separated at spaced intervals of about 4 $\mu$m in the grain boundary 7 in the semiconductor film 3 by photolithography and RIE using the alignment mark 8 as a reference. Thereafter, a gas of $SiH_4$ and $O_2$ is introduced to deposit a gate oxide film 9 to a thickness of about 0.1 $\mu$m on the single-crystal silicon regions 6 at 400° C. by LPCVD.

As shown in FIG. 5C, gate electrodes 10 each having a thickness of 0.3 $\mu$m are deposited on the gate oxide film 9 in the vicinity of the respective crystal nuclei 6a in a gas atmosphere $SiH_4$ and $PH_3$ at 500° C. by LPCVD, and patterned by photolithography and RIE. At the same time, the gate oxide film 9 is removed.

Thereafter, $P^+$ions are introduced into the single-crystal silicon regions 6 at a dose of $2 \times 10^{15}$ $cm^{-2}$ at 40 KeV by ion implantation, forming source regions 30 and drain regions 40. The assembly is then annealed in $N_2$ at 600° C. for 20 hours, forming source and drain layers as shown in FIG. 5D.

An oxide film is then deposited to a thickness of about 0.5 $\mu$m by CVD, and contact holes for the source and drain layers are defined by photolithography and RIE in a gas atmosphere of $CHF_3$ and $O_2$ under 50 mTorr (6.66 Pa) with a power of 1.2 KW. Silicon-doped aluminum is thereafter deposited to a thickness of about 1.0 $\mu$m on the surface so far by sputtering, and patterned into electrodes by photolithography and RIE in a gas atmosphere of $BCl_3$ and $Cl_2$ under 50 mTorr (6.66 Pa) with a power of 0.8 KW, thus fabricating thin-film transistors (not shown).

Representative electric characteristics of the thin-film transistors thus fabricated and conventional thin-film transistors are given in the following table:

|  | $\mu$ $cm^2/V \cdot S$ | S value mV/dec |
| --- | --- | --- |
| Conventional Example | 140 | 93 |
| Inventive Example | 430 | 61 |

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A method of growing a plurality of semiconductor crystals comprising the steps of:

forming a semiconductor film;

forming a plurality of patterned high thermal conductivity regions at one side of the semiconductor film;

heating the semiconductor film from another side of the semiconductor film opposite the side having the high thermal conductivity regions; and cooling the plurality of patterned high thermal conductivity regions and the semiconductor film to form a plurality of semiconductor crystals.

2. The method of growing a plurality of semiconductor crystals of claim 1, wherein the step of heating comprises a step of applying radiation to the film.

3. The method of growing a plurality of semiconductor crystals of claim 2, further comprising a step of forming a low thermal conductivity region between the high thermal conductivity region and the semiconductor film.

4. The method of forming a plurality of semiconductor crystals of claim 3, wherein the step of heating comprises applying laser radiation.

5. A method of growing a plurality of semiconductor crystals comprising the steps of:

providing an insulative substrate;

forming a first low thermal conductivity layer on the substrate;

forming a semiconductor film on the low conductivity layer;

forming a second low thermal conductivity layer on the semiconductor film;

forming a plurality of patterned high thermal conductivity regions on the second low thermal conductivity layer;

heating the semiconductor film from a side opposite the high thermal conductivity regions; and cooling the plurality of patterned high thermal conductivity regions and the semiconductor film to form a plurality of semiconductor crystals.

6. The method of growing a plurality of semiconductor crystals of claim 5, wherein the step of heating comprises a step of applying radiation to the film.

7. The method of growing a plurality of semiconductor crystals of claim 1, further comprising a step of providing an insulative substrate.

8. A method of growing a plurality of semiconductor crystals comprising the steps of:

forming a plurality of patterned high thermal conductivity regions separated by a plurality of other regions having lower thermal conductivity located between the plurality of patterned high thermal conductivity regions;

forming a layer having a relatively low thermal conductivity on the patterned high thermal conductivity regions;

forming a semiconductor film on the low thermal conductivity layer; and heating and cooling the plurality of patterned high thermal conductivity regions and the semiconductor film from a side of the semiconductor film opposite the high thermal conductivity regions.

9. The method of growing a plurality of semiconductor crystals of claim 8, further comprising a step of providing an insulative substrate.

10. The method of growing a plurality of semiconductor crystals of claim 8, wherein the step of heating comprises a step of applying radiation to the film.

* * * * *